US006777958B2

(12) United States Patent
Haag et al.

(10) Patent No.: US 6,777,958 B2
(45) Date of Patent: Aug. 17, 2004

(54) METHOD AND APPARATUS FOR DETECTING A CHANGE IN CAPACITANCE OF A CAPACITIVE PROXIMITY SENSOR

(75) Inventors: Ronald Helmut Haag, Clarkston, MI (US); John Pasiecznik, Jr., Malibu, CA (US)

(73) Assignees: Delphi Technologies, Inc., Troy, MI (US); Hughes Aircraft Company, Troy, MI (US)

( * ) Notice: Subject to any disclaimer, the term of this patent is extended or adjusted under 35 U.S.C. 154(b) by 7 days.

(21) Appl. No.: 10/142,641

(22) Filed: May 10, 2002

(65) Prior Publication Data

US 2003/0071639 A1 Apr. 17, 2003

Related U.S. Application Data

(60) Provisional application No. 60/330,171, filed on Oct. 17, 2001, provisional application No. 60/330,173, filed on Oct. 17, 2001, and provisional application No. 60/361,803, filed on Mar. 5, 2002.

(51) Int. Cl.[7] .......................... G01R 31/08; G01R 27/26
(52) U.S. Cl. .......................... 324/674; 324/672; 324/519
(58) Field of Search .............................. 324/674, 659, 324/667, 672, 519

(56) References Cited

U.S. PATENT DOCUMENTS

| 4,305,007 | A | | 12/1981 | Hughes et al. .............. 307/116 |
|---|---|---|---|---|
| 4,327,323 | A | * | 4/1982 | Walker ....................... 324/663 |
| 4,351,016 | A | | 9/1982 | Felbinger .................... 361/181 |
| 4,410,843 | A | | 10/1983 | Sauer et al. ................. 318/317 |
| 4,453,112 | A | | 6/1984 | Sauer et al. ................. 318/281 |
| 5,027,552 | A | | 7/1991 | Miller et al. .................. 49/27 |
| 5,089,672 | A | | 2/1992 | Miller ...................... 200/61.43 |
| 5,287,086 | A | | 2/1994 | Gibb ......................... 340/618 |
| 5,296,658 | A | | 3/1994 | Kramer et al. ........... 200/61.43 |
| 5,327,680 | A | | 7/1994 | Miller ............................ 49/27 |
| 5,394,292 | A | | 2/1995 | Hayashida .................. 361/179 |
| 5,428,923 | A | | 7/1995 | Waggamon .................... 49/28 |
| 5,463,378 | A | | 10/1995 | Gibb ......................... 340/618 |
| 5,473,461 | A | | 12/1995 | Miremadi ................... 359/189 |
| 5,484,477 | A | | 1/1996 | George et al. .............. 106/499 |

(List continued on next page.)

FOREIGN PATENT DOCUMENTS

| DE | 25 38 531 A1 | 3/1977 |
|---|---|---|
| DE | 19836056 A1 | 2/2000 |
| GB | 2243217 A | 10/1991 |
| GB | 2366385 A | 3/2002 |

OTHER PUBLICATIONS

European Search Report for DE 19836056A, Sep. 22, 2003, 2 pages.
European Search Report for EP 03 07 5592, Jun. 23, 2003, 2 pages.
Synerhy™ Microwave Corporation, Mixers, pp. 43–56.
http://www.hunting.co.uk/info/ddctheory.htm: Digital Down Conversion (DDC) Theory, pp1–6, Jan. 3, 2002.
PCT International Search Report.

Primary Examiner—Anjan K. Deb
Assistant Examiner—John Teresinski
(74) Attorney, Agent, or Firm—Scott A. McBain

(57) ABSTRACT

A method for detecting a change in capacitance of a capacitive sensing element having a nominal capacitance value is disclosed. In an exemplary embodiment, the method includes coupling the sensing element to a first oscillator, the first oscillator generating a first frequency dependent upon the capacitance value of the sensing element. The first frequency is compared to a reference frequency generated by a second oscillator. The change in capacitance from the nominal capacitance value is detected if the first frequency differs from said reference frequency by a determined frequency value.

16 Claims, 4 Drawing Sheets

U.S. PATENT DOCUMENTS

| | | | | |
|---|---|---|---|---|
| 5,651,044 A | | 7/1997 | Klotz, Jr. et al. | 378/117 |
| 5,790,107 A | * | 8/1998 | Kasser et al. | 345/174 |
| 5,801,340 A | | 9/1998 | Peter | 178/19 |
| 5,832,772 A | * | 11/1998 | McEwan | 73/290 R |
| 6,006,386 A | | 12/1999 | Mohaupt | 7/862.68 |
| 6,025,782 A | | 2/2000 | Newham | 340/573.1 |
| 6,078,014 A | | 6/2000 | Kashiwazaki et al. | 200/61.43 |
| 6,158,170 A | | 12/2000 | Brodowsky | 49/28 |
| 6,166,381 A | * | 12/2000 | Augeri et al. | 250/332 |
| 6,229,408 B1 | | 5/2001 | Jovanovich et al. | 333/167 |
| 6,263,199 B1 | | 7/2001 | Wortel et al. | 455/333 |
| 6,275,048 B1 | | 8/2001 | Milli | 324/690 |
| 6,282,413 B1 | | 8/2001 | Baltus | 455/260 |
| 6,288,640 B1 | * | 9/2001 | Gagnon | 340/539 |
| 6,297,605 B1 | | 10/2001 | Butler et al. | 318/466 |
| 6,321,071 B1 | | 11/2001 | Pekkarinen et al. | 455/115 |
| 6,348,862 B1 | | 2/2002 | McDonnell et al. | 340/562 |
| 6,377,009 B1 | | 4/2002 | Philipp | 318/468 |
| 6,429,782 B2 | * | 8/2002 | Pavatich et al. | 340/686.6 |
| 6,455,839 B1 | | 9/2002 | O'Conner et al. | 250/221 |
| 6,499,359 B1 | | 12/2002 | Washeleski et al. | 73/862.473 |
| 6,600,284 B1 | | 7/2003 | Weber et al. | 318/466 |
| 2001/0011894 A1 | | 8/2001 | Havey et al. | 324/662 |
| 2003/0071640 A1 | | 4/2003 | Haag et al. | 324/674 |
| 2003/0071727 A1 | | 4/2003 | Haag et al. | 340/562 |
| 2003/0081369 A1 | | 5/2003 | Haag et al. | 361/302 |

* cited by examiner

METHOD AND APPARATUS FOR DETECTING A CHANGE IN CAPACITANCE OF A CAPACITIVE PROXIMITY SENSOR

CROSS REFERENCE TO RELATED APPLICATIONS

This application claims the benefit of U.S. provisional application No. 60/330,171, filed Oct. 17, 2001, the contents of which are incorporated by reference thereto, and This application claims the benefit of U.S. provisional application No. 60/330,173, filed Oct. 17, 2001, the contents of which are incorporated by reference thereto.

This application further claims the benefit of U.S. provisional application No. 60/361,803, filed Mar. 5, 2002, the contents of which are incorporated by reference herein in their entirety.

BACKGROUND

The present disclosure relates generally to proximity detection systems and, more particularly, to a method and apparatus for detecting a change in capacitance of a capacitive proximity sensor.

Various systems have been devised for detecting obstacles in the path of a moveable panel such as an automotive power window, power sliding door or power hinged door. When an obstacle is detected, forward movement (e.g., closing) of the panel is interrupted and, optionally, the movement of the panel may be thereafter reversed (e.g., opened). These detection systems may generally be characterized as either "contacting" or "non-contacting". In a contacting system, an obstacle is detected only after some form of physical contact occurs between the panel and the obstacle, and may include devices such as pneumatic/pressure sensitive strips, or possibly sensors responsive to changes in mechanical or electrical loading in the apparatus that moves the panel.

On the other hand, in a non-contacting system, an obstacle is detected before actual contact occurs. One specific type of non-contacting obstacle detection system employs the use of a capacitive element(s) as a proximity sensor(s). Capacitive proximity sensors may include one or more electrical conductors formed along the leading edge of a moveable panel, as well as a capacitance sensitive circuit (e.g., a bridge circuit or an oscillator) coupled to the conductor(s). An obstacle (e.g., a human hand) in proximity to the conductor(s) changes the capacitance of the sensor, which change is thereafter detected by the capacitance sensitive circuit.

Unfortunately, certain difficulties are inherent in creating a sensitive capacitive proximity system that can distinguish between changes in environmental conditions and an actual foreign object. A sufficiently sensitive capacitive proximity detection system should be responsive to relatively small changes in sensor capacitance. However, certain high frequency components used in conjunction with a sensitive device can result in unwanted radiated emissions to neighboring electronic components. In addition, any control module used for the processing of a detected capacitance change will generally be provided with a lower frequency integrated circuit(s), thus presenting a compatibility problem between the higher frequency sensor signal and the integrated circuit.

SUMMARY

The above discussed and other drawbacks and deficiencies of the prior art are overcome or alleviated by a method for detecting a change in capacitance of a capacitive sensing element having a nominal capacitance value. In an exemplary embodiment, the method includes coupling the sensing element to a first oscillator, the first oscillator generating a first frequency dependent upon the capacitance value of the sensing element. The first frequency is compared to a reference frequency generated by a second oscillator. The change in capacitance from the nominal capacitance value is detected if the first frequency differs from said reference frequency by a determined frequency value.

In a preferred embodiment, the first oscillator and the second oscillator are configured such that the first frequency and the reference frequency are offset from one another by a fixed offset value when the capacitance of the capacitive sensing element is equal to the nominal capacitance value. In addition, the first frequency and the reference frequency are inputted into a mixer. An output of the mixer is then inputted into a low pass filter, wherein an output of the low pass filter is an intermediate frequency (IF) that corresponds to the difference between the first frequency and the reference frequency. The intermediate frequency (IF) is preferably in the range of about 0 to about 15 MHz, while the first frequency and reference frequency are at least 900 MHz.

In still a further embodiment, the intermediate frequency is transmitted to a control module where the intermediate frequency is then compared to the fixed offset value. Thereby, an increase in capacitance from the nominal capacitance value is detected if the intermediate frequency exceeds the fixed offset value.

BRIEF DESCRIPTION OF THE DRAWINGS

Referring to the exemplary drawings wherein like elements are numbered alike in the several Figures.

DETAILED DESCRIPTION

Disclosed herein is a method and apparatus for detecting a relatively small change in the capacitance of a capacitive sensing element, such as may be found in a non-contact obstacle detection system. Although the following disclosure is described in the context of an obstacle detection system for use in conjunction with a power door or gate of a motor vehicle, it will be understood that present invention embodiments are equally applicable to any proximity detection system and, more generally, to any system using one or more capacitive sensing elements.

Figure 1:
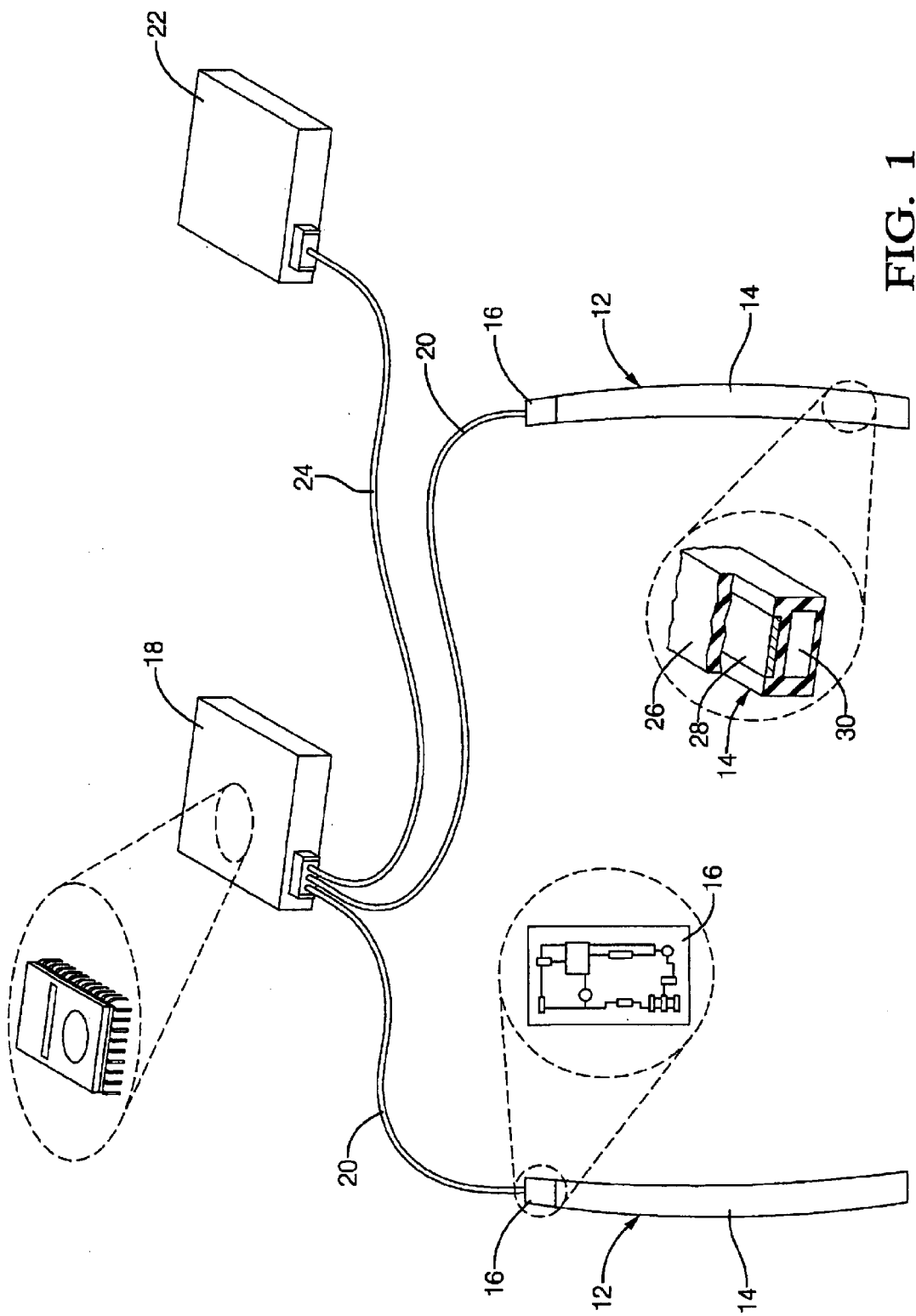
FIG. 1 is a schematic diagram of a non-contact obstacle detection system, including one or more capacitive sensing elements and associated high sensitivity capacitance detection circuits, in accordance with an embodiment of the invention.

Referring initially to FIG. 1, there is shown a schematic diagram of a non-contact obstacle detection system 10, which could be implemented, for example, in conjunction with a motor vehicle power door assembly. The obstacle detection system 10 may include one or more capacitive sensing elements 12, each configured to have a desired nominal capacitance value. Each individual capacitive sensing element 12 further includes a flexible capacitive strip 14 (as highlighted in insert "A") having a high sensitivity capacitance detector (HSCD) circuit 16 integrated therein. The HSCD circuit 16 is symbolized in insert "B".

The sensing elements 12 are each coupled to a central control module 18 through lines 20. As is described in greater detail hereinafter, the lines 20 preferably include a twisted pair of conductors or, alternatively, a length of coaxial cable. In either case, the lines 20 provide a means of supplying a direct current (DC) power signal from the central control module 18 to the HSCD circuit 16. Furthermore, the central control module 18 receives an output signal from each of the sensing elements 12 through lines 20, and determines whether there is a detected change in capacitance of any of the sensing elements 12. In the event that a foreign object is in proximity to one or more sensing elements 12 during a closing operation of a power door or panel, the central control module 18 will generate a command signal to stop the closing operation. This may be accomplished, in one embodiment, by coupling the central control module 18 to a power door control module 22 through a data line 24.

Additional details regarding the obstacle detection system 10 may be found in U.S. patent applications, Ser. No. 10/142,643, entitled "Flexible Capacitive Strip for Use in a Non-Contact Obstacle Detection System", Ser. No. 10/142,641, entitled "Method and Apparatus for Detecting a Change in Capacitance of a Capacitive Proximity Sensor", Ser. No. 10/142,680, entitled "Capacitive Sensor Assembly for Use in a Non-Contact Obstacle Detection System", each of which were filed on May 10, 2002, the contents of which are incorporated herein by reference. Generally speaking, the central control module 18 will preferably include computer hardware and associated software therein (represented symbolically in insert "C") for comparing output signals from the HSCD circuits 16 to nominal values stored in lookup/profile tables.

As shown in insert "A", the flexible capacitive strip 14 (in one possible embodiment) may be formed by extruding an insulating, flexible material 26 (such as santoprene rubber) around a flat conductor 28. The conductor 28 serves as one capacitor electrode of the capacitive sensing element 12. The conductor 28 is further designed to be substantially parallel to a surface (not shown), along the entire length of the strip 14, when the strip 14 is affixed to the surface. In one embodiment, the conductor 28 serves as one capacitor electrode, while the surface (e.g., a metallic vehicle body) serves as the other electrode. An air cavity 30 within the strip 14 serves, in one aspect, as a dielectric material between the capacitor electrodes. Alternatively, the sensing element 12 may be designed with two conductors molded internally therein. Additional details regarding the capacitive sensing element 12 may be found in U.S. Patent applications, Ser. No. 10/142,643, entitled "Flexible Capacitive Strip for Use in a Non-Contact Obstacle Detection System", Ser. No. 10/142,641, entitled "Method and Apparatus for Detecting a Change in Capacitance of a Capacitive Proximity Sensor", Ser. No. 10/142,680, entitled "Capacitive Sensor Assembly for Use in a Non-Contact Obstacle Detection System", each of which were filed on May 10, 2002, the contents of which are incorporated herein by reference.

Figure 2:
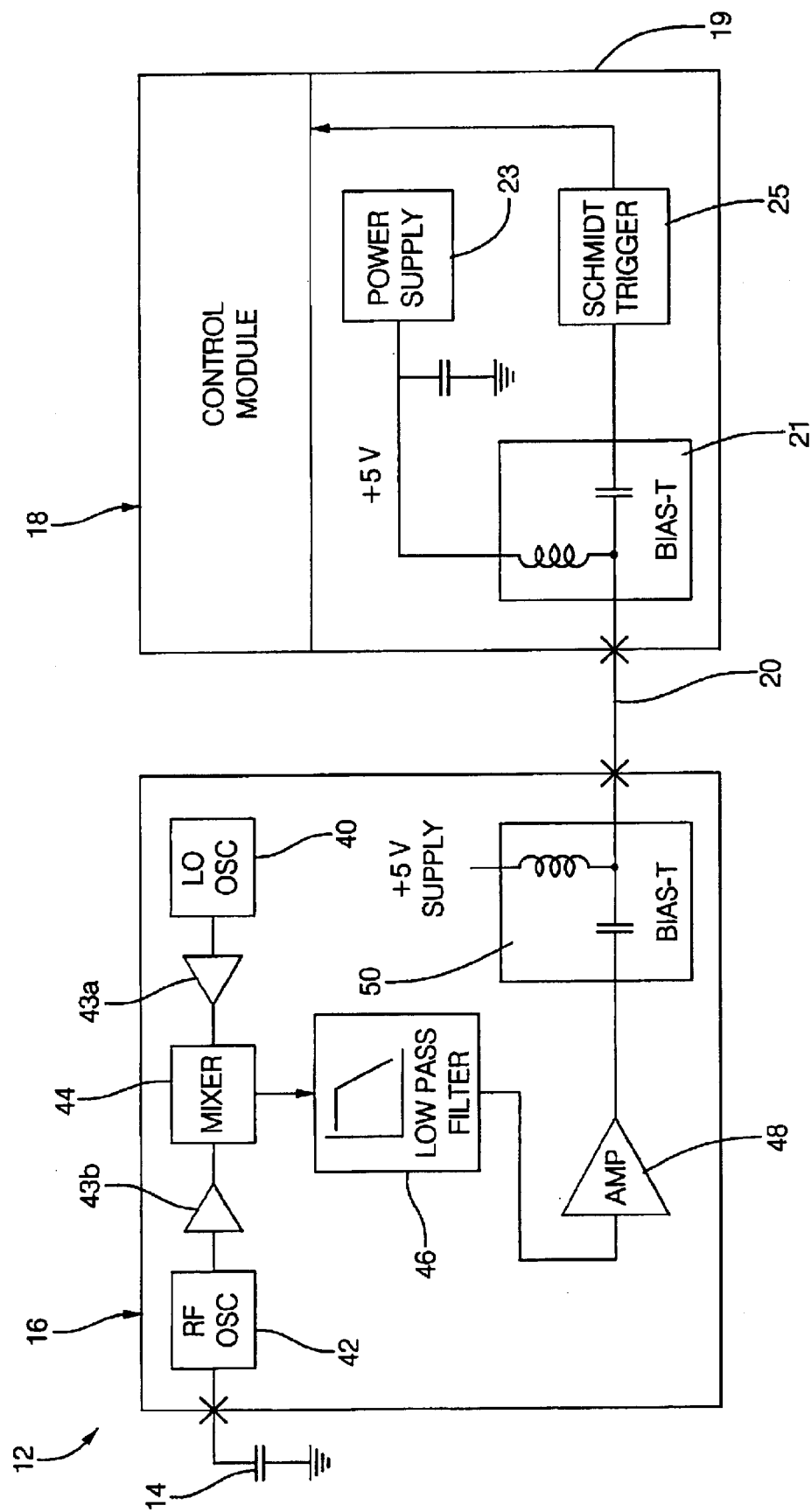
FIG. 2 is a block diagram of an exemplary high sensitivity capacitance detector (HSCD) along with the associated control module circuitry connected thereto.

Referring now to the block diagram of FIG. 2, the HSCD 16 includes a fixed (local) oscillator 40, a variable (RF) oscillator 42, a mixer 44, a low pass filter 46, gain stage 48, and a bias "T" arrangement 50. The fixed oscillator 40 produces a frequency output that is stable in nature. By way of example, the frequency of the fixed oscillator 40 may be set at a fixed frequency, $f_{LO}$, of about 925 MHz. However, it can be set at any desired frequency. The variable oscillator 42 is coupled to the capacitive strip 14 of a capacitive sensing element 12 as described above, such that the variable oscillator 42 generates an output frequency that is dependent upon the capacitance value of the capacitive strip 14. In a preferred embodiment, the variable oscillator 42 is set up to generate a frequency, $f_{RF}$, of about 922 MHz (or, in other words, at a fixed offset of about 3 MHz from the fixed oscillator) in a steady state environment. A "steady state" environment refers to a condition wherein there is no foreign object in proximity to a given sensing element 12. In such a situation, the capacitance value of the strip 14 remains at its nominal value as determined by its physical parameters, and $\Delta C=0$.

If a hand or other foreign object approaches the sensor strip 14, the capacitance value thereof will increase such that $\Delta C \neq 0$. As a result, the output frequency, $f_{RF}$, of the variable oscillator 42 is also changed such that $\Delta f_{RF}$ is proportional to $\Delta C$. More specifically, an increase in the capacitance of the sensor strip 14 will cause the output frequency, $f_{RF}$, of the variable oscillator 42 to decrease.

Both the fixed oscillator output frequency and the variable oscillator output frequency are fed through return loss attenuators 43a and 43b, respectively, and inputted into mixer 44 where the two signals are both subtracted and added together. As is well known in the art, mixers are used in RF communication technology to shift a baseband information signal to a frequency or frequencies suitable for electromagnetic propagation to the desired destination. In this case, the frequency to be shifted is the variable frequency $f_{RF}$. When mixed with the output of the fixed (i.e., local) oscillator 40, the result is two outputs at the intermediate frequency (IF) port of the mixer 44. These IF outputs may be represented as $f_{LO}+f_{RF}$ and $f_{LO}-f_{RF}$. In a steady state mode, therefore, the resulting mixer output frequencies are about 3 MHz and 1847 MHz.

If the desired IF signal is higher than the RF signal, the mixer is considered an upconverter; if the desired IF signal is lower than the RF signal, then the mixer is considered a downconverter. As is described hereinafter, the desired IF component for the present HSCD 16 is the frequency difference between the local oscillator 40 and the fixed oscillator 42. Thus, frequency down conversion is applied by inputting the output of the mixer 44 through the low pass filter 46 in order to pass through the difference of the two frequencies. The low pass filter 46 is preferably designed such that a capacitance change seen at a sensing element 12 (and resulting frequency change of the variable oscillator 42), caused by the presence of a foreign object, is recognized and detected in the form of a change (i.e., increase) in $f_{LO}-f_{RF}$.

The output of the low pass filter 46 is then amplified by gain stage 48 before being transmitted to the control module 18 for processing. As will be noted later, the low pass filter 46 can also be configured to be part of the feedback network of gain stage 48. The bias "T" arrangement 50 is incorporated to reduce the number of wiring connections used to couple the control module to the HSCD. As is known in the art, a bias "T" is used to couple a DC voltage onto the same transmission line used for AC (RF) signals, or to detect/remove the DC component of a composite signal. Thus, if a bias "T" is used, a two-wire twisted pair conductor may be used for lines 20 to couple the control module 18 to the HSCD 16. Alternatively, a coaxial cable may be used.

In a simple form, a bias "T" may include an inductive choke or, for frequencies exceeding 1 GHz, specifically tuned elements on a circuit board. Additional information on bias "T" arrangements may be found in U.S. Pat. No. 6,229,408 to Jovanovich, et al. It will be appreciated that, if multiple sensing elements 12 are used in system 10, then the central control module 18 will include a multiple bias "T" arrangement. In the present embodiment, the AC signal output from gain stage 48 travels through the bias "T" 50 to the control module 18, while a 5-volt (for example) DC signal is sent from the control module 18 to the HSCD 16 to provide power thereto.

As shown in FIG. 2, the control module 18 farther includes a front-end electronics area 19 having a corresponding bias "T" 21. An internal power supply 23 provides a regulated, +5V output voltage for use by the HSCD 16. On the receiving side, bias "T" 21 also strips off the incoming IF signal from the HSDC 16, so that the IF signal may be passed through a Schmidt trigger 25 and then on to digital processing by software within the control module 18.

Figure 3:
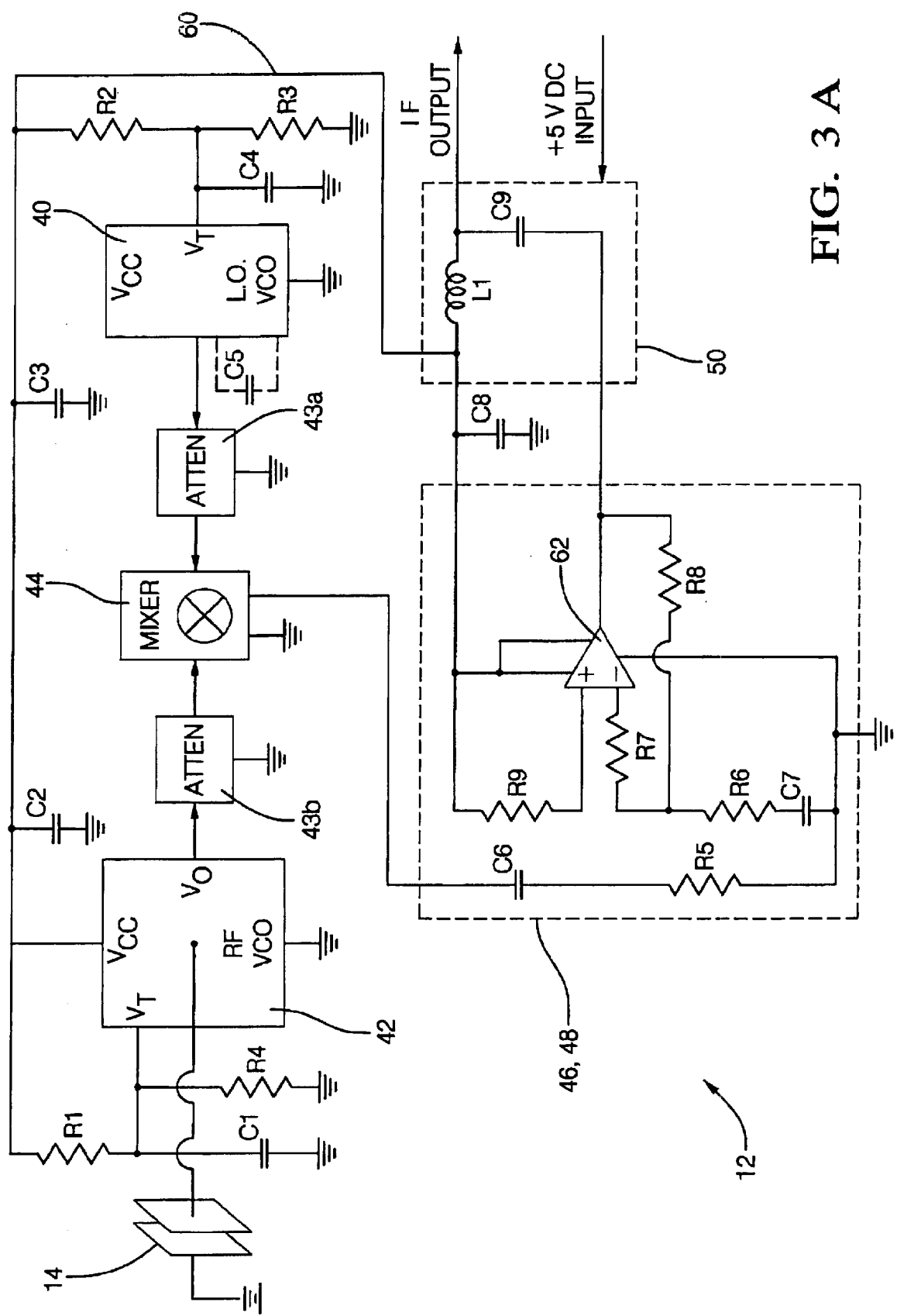
FIG. 3(a) is a schematic diagram illustrating one possible circuit implementation of the HSCD shown in FIG. 2.
FIG. 3(b) is a schematic diagram illustrating one possible circuit implementation of the associated control module circuitry shown in FIG. 2.
Figure 3:
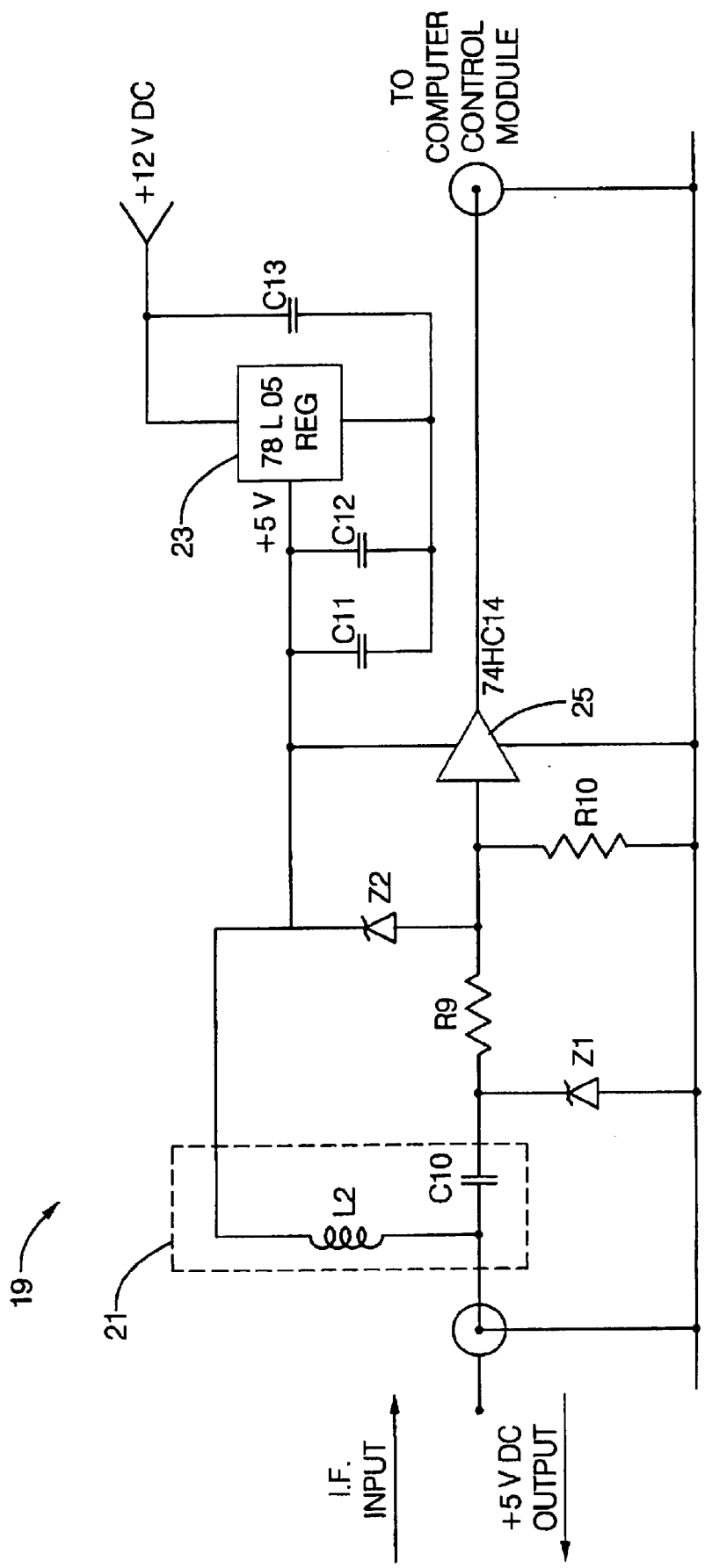

Referring now to FIG. 3(a), there is shown one possible circuit embodiment that realizes the block diagram functions of the HSCD 16 illustrated in FIG. 2. As is shown, the bias "T" 50 includes coupling capacitor C9 and inductor L1. Capacitor C9 couples the output IF signal from low pass filter 46 and gain stage 48 onto the signal line, while the inductor L1 provides a high AC impedance so as to prevent the IF signal from being fed back onto the +5V DC bus 60. An exemplary value for L1 is about 220 microhenries ($\mu$H), while C9 may be chosen to be about 0.047 microfarads ($\mu$F).

A plurality of filter capacitors C1, C2, C3 and C4 are used to reduce any ripple effects on the DC bus 60 that could be generated by the RF oscillator 42 and the local oscillator 40. Particularly, C2 and C3 also serve to isolate one oscillator from the other. The capacitance values of C1 through C4 are relatively small (e.g., 0.1 $\mu$F) as compared to that of capacitor C8 (e.g., 3.3 $\mu$F), C8 being used to store the DC energy supplied to the HSCD.

FIG. 3(a) further schematically illustrates the capacitive strip 14 coupled to the RF oscillator 42. Although not shown, a series capacitor is preferably coupled between the capacitive strip 14 and the RF oscillator 42, thereby forming a capacitive divider, in order to reduce the sensitivity of the circuit and to keep radiated emissions in the FCC approved band. In addition, resistors R1 and R4 (e.g., 2.1 k$\Omega$ and 1.2 k$\Omega$, respectively) are configured as a voltage divider to provide a trim point for the RF oscillator 42.

The local oscillator 40 is preferably buffered down with a bias loading so as to maintain a steady state, 3 MHz offset from the RF oscillator 42. Accordingly, an external capacitor C5 (having an exemplary capacitance of about 30 pF) is coupled to the local oscillator 40. Resistors R2 and R4 (e.g., 2.1 k$\Omega$ and 560 $\Omega$, respectively) are configured as a voltage divider to provide a trim point for local oscillator 40.

Although the obstacle detection system 10 utilizes environmental compensation software in its control module 18, an additional measure of compensation for variation in operating conditions (e.g., temperature changes) is provided by using the same type of oscillator for both the RF oscillator 42 and the local oscillator 40. In so doing, the effect on the output frequency of the local oscillator 40 (for example, as the result of a temperature change) will not affect the frequency difference between the RF oscillator 42, since the temperature change should have the same effect on the output frequency of the RF oscillator 42.

The low pass filter 46 and gain stage 48 are shown in FIG. 3(a) as an integrated element. A first order, low pass filter is configured by coupling capacitor C6 to the output of mixer 44. The capacitance value of C6 may be chosen to be about 30 nanofarads (nF) to provide a 3 dB signal attenuation at around 10 MHz. The gain stage 48 includes an operational amplifier 62, with associated bias resistors R4 and R5, feedback resistors R6, R7 and R8, and feedback filter capacitor C7.

Finally, FIG. 3(b) is a schematic diagram illustrating one possible circuit implementation of the associated control module circuitry 19 shown in FIG. 2. The corresponding bias "T" 21 therein includes inductor L2 and capacitor C10. A pair of zener diodes Z1, Z2 provide voltage regulation for the output of power supply 23, as well as the Schmidt trigger 25. Capacitor C11, C12 and C13 further provide filtering for the power supply 23, which illustrates (by way of example) a +12 VDC input voltage, common in automotive systems.

It should be understood that the circuit shown in FIG. 3(a) represents but one exemplary implementation of the HSCD, and those skilled in the art will recognize that several alternative circuit configurations are possible and may be configured to fall within the scope of the present invention embodiments.

As will be appreciated from the foregoing description, the HSCD method and apparatus takes advantage of frequency down conversion to allow for sufficient sensitivity to detect small changes in capacitance, while providing for the high frequency components (local oscillator 40, variable oscillator 42) to be localized at the sensing elements. In other words, a change in sensor strip capacitance, initially represented by a small frequency change in the output of the variable oscillator 42, is down converted to an intermediate frequency (IF) that is more suitable for use by the remaining portion of the overall system. Accordingly, the frequency down conversion technique keeps the 900 MHz signals contained within the HSCD 16, while the difference signal $f_{LO}-f_{RF}$ is the only frequency transmitted to another area of the vehicle. Since the difference signal ranges only from about 0 to about 15 MHz, it is possible (with the bias "T") to use a twisted pair for the signal transmission to the central control module 18, thereby providing a more cost effective alternative to a coaxial cable and connector system. Of course and in an alternative embodiment, the circuit or system can be adapted to operate outside the aforementioned range.

It should also be understood, however, that although a preferred frequency range of operation has been discussed, the HSCD will operate at any frequency. The embodiments discussed operate in the 902–928 Mhz ISM band, set aside by the FCC for field disturbance sensors. This band is wide enough to accommodate the swing of the RF oscillator. At lower frequencies, however, the swing may exceed the specified FCC band limits. Moreover, the 900 MHz band allows for a higher radiated power level than at lower frequencies. While the sensitivity of the HSCD is not dependent upon the oscillator power level, the FCC does regulate the maximum radiated power level.

Another benefit of the present design is that a clean digital signal is transmitted to the central control module 18. Smooth edges due to a sine wave limits $2^{nd}$ and $3^{rd}$ order harmonics to acceptable levels to meet the radiated emission requirements included the FCC regulations and applicable OEM specifications. In addition, variances in the power supply parameters (ripple or voltage drops) do not change the output signal frequency in the present design, since both oscillators will shift up or down in frequency as a result of any the above mentioned conditions. In other words, system sensitivity is not dependent on specific the power levels present thereon, provided the oscillators remain stable.

Still a further benefit of the present HSCD design is that the proximity detection system is self-adjusting for environmental conditions. Since the low pass filter 46 is designed to have a bandwidth of 15 MHz (although a wider bandwidth may be chosen if desired) and the steady state frequency difference, $f_{LO}-f_{RF}$, is set up at approximately 3 MHz, a 2 MHz change (decrease) in $f_{RF}$ is sufficient to determine that an obstacle is in proximity to the sensor element. Accordingly, the dynamic range of the HSCD may be increased and $f_{LO}-f_{RF}$ may be set to allow for environmental changes such as temperature change, mud splattering, light rain, and other conditions.

It should also be pointed out that the sensor strip design itself is of particular concern with regard to the functioning of the HSCD 16. The steady state capacitance value of the strip 14 should not be too large so as to swamp out the RF oscillator. If the capacitance value is too large, then the RF oscillator 42 could be pulled down and prevented from operating at the proper frequency, thereby becoming unstable. Thus, the impedance of the strip 14 is preferably chosen from about 50 ohms ($\Omega$) to about 200 $\Omega$. An impedance of about 200 $\Omega$ provides more device sensitivity due to a lower capacitance value, but the output radiated power is increased. At 50 $\Omega$, the radiated power is reduced, but the device sensitivity decreases due to a larger steady state capacitance, thereby limiting the operating frequency range. Accordingly, a strip 14 having a characteristic impedance of about 100 $\Omega$ provides a good compromise for sensitivity and radiated emission concerns.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for detecting a change in capacitance of a capacitive sensing element having a nominal capacitance value, the method comprising:

employing a single non-Contact capacitive sensing element;

coupling the sensing element to a first oscillator, said first oscillator generating a first frequency dependent upon the capacitance value of the sensing element; and comparing said first frequency to a reference frequency, said reference frequency being a second frequency generated by a second oscillator;

wherein the change in capacitance from the nominal capacitance value is detected it said first frequency differs from said reference frequency by a determined frequency value.

2. The method of claim 1, further comprising:

configuring said first oscillator such that said first frequency and said reference frequency are offset from one another by a fixed offset value when the capacitance of said capacitive sensing element is equal to the nominal capacitance value.

3. The method of claim 2, further comprising:

inputting said first frequency and said reference frequency into a mixer; and inputting an output of said mixer into a low pass filter;

wherein an output of said low pass filter is an intermediate frequency (IF), said intermediate frequency corresponding to the difference between said first frequency and said reference frequency.

4. The method of claim 3, wherein said intermediate frequency (IF) is in the range of about 0.01 to about 15 MHz.

5. The method of claim 4, wherein said first frequency and said reference frequency are at least 900 MHz.

6. The method of claim 3, further comprising:

transmitting said intermediate frequency to a control module; and comparting said intermediate frequency to said fixed offset value; said fixed offset value being stored with in said control module;

wherein an increase in capacitance from the nominal capacitance value is detected is said intermediate frequency exceeds said fixed offset value.

7. An apparatus for detecting a change in capacitance of a single non-contact capacitive sensing element having a nominal capacitance value, comprising:

a first oscillator coupled to the single non-contact capacitive sensing element, said first oscillator generating a first frequency dependent upon the capacitance value of the sensing element;

a second oscillator generating a reference frequency; and a device for comparing said first frequency to said reference frequency;

wherein the change in capacitance from the nominal capacitance value is detected if said first frequency differs from said reference frequency by a determined frequency value.

8. The apparatus of claim 7, wherein said first frequency generated by said first oscillator and said reference frequency generated by said second oscillator are offset from one another by a fixed offset value when the capacitance of said capacitance sensing element is equal to the nominal capacitance value.

9. The apparatus of claim 8, further comprising:

a mixer, said mixer having said first frequency as a first input thereto and said reference frequency as a second input thereto; and a low pass filter, said low pass filter having an output of said mixer as an input thereto;

wherein an output of said low pass filter is an intermediate frequency (IF), said intermediate frequency corresponding to the difference between said first frequency and said reference frequency.

10. The apparatus of claim 9, wherein said intermediate frequency (IF) is in the range of about 0.01 to about 15 MHz.

11. The apparatus of claim 10, wherein said first frequency and said reference frequency are at least 900 MHz.

12. The apparatus of claim 11, wherein siad fixed offset value is about 3 MHz.

13. The apparatus of claim 9, further comprising:

a control module;

a signal line for transmitting said intermediate frequency to said control module; and said intermediate frequency being compared to said fixed offset value, said fixed offset value further being stored with in said control module;

wherein an increase in capacitance from the nominal capacitance value is detected if said intermediate frequency exceeds said fixed offset value.

14. The apparatus of claim 13, further comprising:

a bias "T" arrangement, configured between said low pass filter and said signal line, said bias "T" arrangement enabling said signal line to simultaneously transmit said intermediate frequency to said control module and a DC power signal from said control module.

15. The apparatus of claim 14, wherein said signal line comprises a twisted pair of conductors.

16. A capacitive sensing element, comprising:

a single non-contact capacitive strip having a nominal capacitance value; and a capacitance detection circuit integrated within said capacitive strip, said capacitance detection circuit further comprising:

a first oscillator coupled to the capacitive strip, said first oscillator generating a first frequency dependent upon the capacitance value of the capacitive strip; and a second oscillator generating a reference frequency, said reference frequency being offset from said first frequency by a fixed offset value when the capacitance of said capacitive strip equals said nominal capacitance value;

wherein a change in capacitance of the capacitive strip from said nominal capacitance value is detected if said first frequency differs from said reference frequency by mere than said fixed offset value.

* * * * *